(12) United States Patent
Lee et al.

(10) Patent No.: US 12,106,799 B2
(45) Date of Patent: Oct. 1, 2024

(54) FORMING METHOD OF SENSE AMPLIFIER AND LAYOUT STRUCTURE OF SENSE AMPLIFIER

(71) Applicant: CHANGXIN MEMORY TECHNOLOGIES, INC., Hefei (CN)

(72) Inventors: Tzung-Han Lee, Hefei (CN); Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 190 days.

(21) Appl. No.: 17/805,744

(22) Filed: Jun. 7, 2022

(65) Prior Publication Data

US 2023/0008008 A1    Jan. 12, 2023

(30) Foreign Application Priority Data

Jul. 8, 2021 (CN) .......................... 202110775217.X (51) Int. Cl.
| | |
|---|---|
| *G11C 11/417* | (2006.01) |
| *G11C 11/412* | (2006.01) |
| *H10B 10/00* | (2023.01) |

(52) U.S. Cl.
CPC .......... *G11C 11/417* (2013.01); *G11C 11/412* (2013.01); *H10B 10/12* (2023.02)

(58) Field of Classification Search
CPC ..... G11C 11/417; G11C 11/412; G11C 7/065; H10B 10/12; H10B 10/18; H01L 27/0207; H01L 21/48; H01L 27/0203
See application file for complete search history.

(56) References Cited

U.S. PATENT DOCUMENTS

| | | | |
|---|---|---|---|
| 2017/0117291 | A1 | 4/2017 | Or-Bach et al. |
| 2018/0061487 | A1 | 3/2018 | Liaw |
| 2020/0395366 | A1* | 12/2020 | Chen ...................... H10B 43/27 |

(Continued)

FOREIGN PATENT DOCUMENTS

| | | |
|---|---|---|
| CN | 104078379 B | 3/2017 |
| CN | 110400797 A | 11/2019 |

OTHER PUBLICATIONS

TW Office Action cited in TW111125195, mailed Sep. 8, 2023, 24 pages.

*Primary Examiner* — Donald H B Braswell
(74) *Attorney, Agent, or Firm* — Kilpatrick Townsend & Stockton LLP (57) ABSTRACT

The present disclosure relates to a method of forming a sense amplifier and a layout structure of a sense amplifier. The method includes: providing a first active region pattern layer, the first active region pattern layer includes a bridge pattern, and a first active region pattern region and a second active region pattern region; the first active region pattern region includes a first active region pattern for defining a first pull-down transistor of a first memory cell structure; the second active region pattern region includes a first symmetrical active region pattern for defining a second pull-down transistor of a second memory cell structure; and the first active region pattern and the first symmetrical active region pattern are adjacent to each other and connected through the bridge pattern, a source of the first pull-down transistor and a source of the second pull-down transistor are electrically connected through the bridge pattern.

15 Claims, 4 Drawing Sheets

(56) References Cited

U.S. PATENT DOCUMENTS

| | | |
|---|---|---|
| 2021/0071766 A1 | 3/2021 | Yajima et al. |
| 2021/0305262 A1* | 9/2021 | Wang ................. H01L 29/78696 |
| 2022/0140099 A1* | 5/2022 | Kim .................. H01L 29/42392 |
| | | 257/329 |
| 2023/0105461 A1* | 4/2023 | Kim ..................... H10B 10/125 |
| | | 257/369 |

* cited by examiner

FORMING METHOD OF SENSE AMPLIFIER AND LAYOUT STRUCTURE OF SENSE AMPLIFIER

CROSS-REFERENCE TO RELATED APPLICATION

This disclosure claims the priority of Chinese Patent Application No. 202110775217.X, submitted to the Chinese Intellectual Property Office on Jul. 8, 2021, the disclosure of which is incorporated herein in its entirety by reference.

TECHNICAL FIELD

The present disclosure relates to the technical field of semiconductor manufacturing, and in particular, to a forming method of a sense amplifier, and a layout structure of a sense amplifier.

BACKGROUND

With the rapid development of integrated circuit processes, semiconductor products need to meet a higher integration requirement. As a result, the size of a single semiconductor device and the area of an isolation space between active regions of adjacent devices are required to be reduced constantly, to ensure that the size of the integrated circuit product meets the application requirements.

However, in the conventional integrated circuit products, there is a large isolation space between active regions of adjacent devices, which is prone to introduce large interference factors, resulting in larger areas of a single cell and an array region. A multi-layer process is relatively complex, which imposes high requirements on design rules for each layer of the layout structure. Moreover, pattern shapes on the layout structure are not uniform, resulting in high complexity of a lithography process.

SUMMARY

The present disclosure relates to the technical field of semiconductor manufacturing, and in particular, to a forming method of a sense amplifier, and a layout structure of a sense amplifier.

According to a first aspect, the present disclosure provides a forming method of a sense amplifier, including:

providing a first active region pattern layer, where the first active region pattern layer includes a bridge pattern, and a first active region pattern region and a second active region pattern region that are spaced apart in a first direction and symmetrically arranged along a central axis of the bridge pattern;

the first active region pattern region is used for defining a first memory cell structure, and includes a first active region pattern for defining a first pull-down transistor of the first memory cell structure;

the second active region pattern region is used for defining a second memory cell structure, and includes a first symmetrical active region pattern for defining a second pull-down transistor of the second memory cell structure; and the first active region pattern and the first symmetrical active region pattern are adjacent to each other and connected through the bridge pattern, such that a source of the first pull-down transistor and a source of the second pull-down transistor are electrically connected through the bridge pattern.

According to another aspect, the present disclosure provides a layout structure of a sense amplifier, including: a first active region pattern layer, where the first active region pattern layer includes a bridge pattern, and a first active region pattern region and a second active region pattern region that are spaced apart in a first direction and symmetrically arranged along a central axis of the bridge pattern; the first active region pattern region is used for defining a first memory cell structure, and includes a first active region pattern for defining a first pull-down transistor of the first memory cell structure; the second active region pattern region is used for defining a second memory cell structure, and includes a first symmetrical active region pattern for defining a second pull-down transistor of the second memory cell structure; and the first active region pattern and the first symmetrical active region pattern are adjacent to each other and connected through the bridge pattern, such that a source of the first pull-down transistor and a source of the second pull-down transistor are electrically connected through the bridge pattern.

BRIEF DESCRIPTION OF THE DRAWINGS

To better describe and illustrate the embodiments and/or examples of the applications disclosed herein, reference may be made to one or more accompanying drawings. Additional details or examples for describing the drawings should not be considered as limitations on the scope of any one of the disclosed applications, the currently described embodiment and/or example, and the optimal mode of the applications as currently understood.

DETAILED DESCRIPTION

To facilitate the understanding of the present disclosure, the present disclosure is described more completely below with reference to the related accompanying drawings. The preferred embodiments of the present disclosure are shown in the accompanying drawings. However, the present disclosure may be embodied in various forms without being limited to the embodiments described herein. On the contrary, these embodiments are provided to make the present disclosure more thorough and comprehensive.

Unless otherwise defined, all technical and scientific terms used herein have the same meaning as commonly understood by those skilled in the technical field of the present disclosure. The terms mentioned herein are merely for the purpose of describing specific embodiments, rather than to limit the present disclosure. The term "and/or" used herein includes any and all combinations of one or more of the associated listed items.

It should be understood that when an element or layer is described as "being on", "being adjacent to", "being connected to" or "being coupled to" another element or layer, it can be on, adjacent to, connected to, or coupled to the another element or layer directly, or intervening elements or layers may be present. On the contrary, when an element is described as "being directly on", "being directly adjacent to", "being directly connected to" or "being directly coupled to" another element or layer, there are no intervening elements or layers. It should be understood that although terms such as first, second, and third may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teachings of the present disclosure, the first element, component, region, layer or section discussed below may a second element, component, region, layer or section.

Spatial relationship terms such as "under", "beneath", "lower", "below", "above", and "upper" can be used herein to conveniently describe the relationship shown in the figure between one element or feature and another element or feature. It should be understood that in addition to the orientations shown in the figure, the spatial relationship terms are intended to further include different orientations of used and operated devices. For example, if a device in the accompanying drawings is turned over, and then described as being "beneath another element", "below it", or "under it", the device or feature is oriented "on" the another element or feature. Therefore, the exemplary terms "beneath" and "under" may include two orientations of above and below. The device may be otherwise oriented (rotated by 90 degrees or other orientations), and the spatial description used herein is interpreted accordingly.

The purpose of the terms used herein is only to describe specific embodiments instead of being a limitation of the present disclosure. In this specification, the singular forms of "a", "an" and "the/this" also include plural forms, unless clearly indicated otherwise. It should also be understood that terms "include" and/or "comprise", when used in this specification, determine the presence of features, integers, steps, operations, elements and/or components, but do not exclude the presence or addition of one or more other features, integers, steps, operations, elements, components and/or groups. In this specification, the term "and/or" includes any and all combinations of related listed items.

The embodiments of the present disclosure are described herein with reference to cross-sectional views as schematic diagrams of the ideal embodiments (and intermediate structures) of the present disclosure. In this way, changes from the shown shape due to, for example, the manufacturing technology and/or tolerances can be expected. Therefore, the embodiments of the present disclosure should not be limited to the specific shapes of the regions shown herein, but include shape deviations due to, for example, manufacturing. The regions shown in the figure are schematic in nature, and their shapes are not intended to show the actual shapes of the regions of the device and limit the scope of the present disclosure.

Refer to FIG. 1 to FIG. 6b. It should be noted that, the drawings provided in this embodiment merely illustrate the basic concept of the present disclosure schematically. Although the drawings only show components related to the present disclosure rather than being drawn according to the quantities, shapes, and sizes of components in actual implementation, patterns, quantities, and proportions of components in actual implementation may be changed randomly, and the component layout may be more complex.

Figure 1:
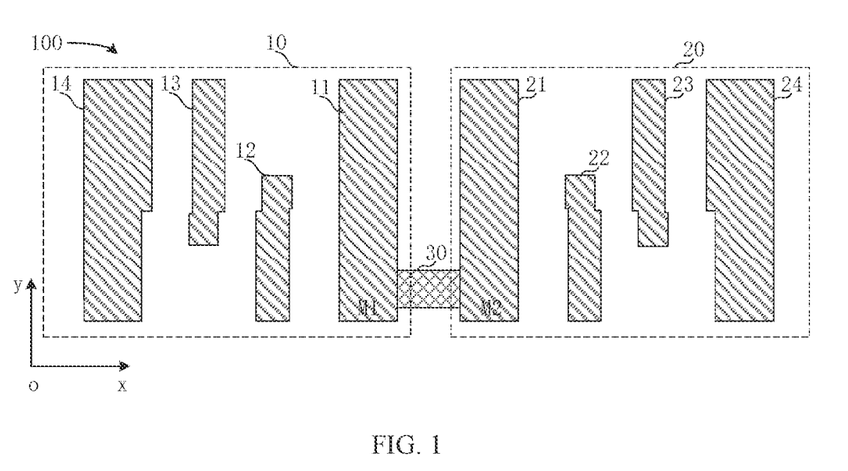
FIG. 1 is a schematic top view of a layout structure of a sense amplifier according to an embodiment of the present disclosure.

Referring to FIG. 1, in an embodiment of the present disclosure, a forming method of a sense amplifier is provided, including: providing a first active region pattern layer 100, where the first active region pattern layer 100 includes a bridge pattern 30, and a first active region pattern region 10 and a second active region pattern region 20 that are spaced apart in a first direction and symmetrically arranged along a central axis of the bridge pattern 30; the first active region pattern region 10 is used for defining a first memory cell structure (not shown), and includes a first active region pattern 11 for defining a first pull-down transistor of the first memory cell structure; the second active region pattern region 20 is used for defining a second memory cell structure (not shown), and includes a first symmetrical active region pattern 21 for defining a second pull-down transistor of the second memory cell structure; and the first active region pattern 11 and the first symmetrical active region pattern 21 are adjacent to each other and connected through the bridge pattern 30, such that a source of the first pull-down transistor and a source of the second pull-down transistor are electrically connected through the bridge pattern 30.

Specifically, further referring to FIG. 1, the first active region pattern region 10 and the second active region pattern region 20 in the first active region pattern layer 100 are spaced apart in the first direction, e.g., Ox, and symmetrically arranged along the central axis of the bridge pattern 30; the first active region pattern region 10 is used for defining the first memory cell structure, and includes the first active region pattern 11 for defining the first pull-down transistor of the first memory cell structure; the second active region pattern region 20 is used for defining the second memory cell structure, and includes the first symmetrical active region pattern 21 for defining the second pull-down transistor of the second memory cell structure; the first active region pattern 11 and the first symmetrical active region pattern 21 are adjacent to each other and connected through the bridge pattern 30, such that the source of the first pull-down transistor and the source of the second pull-down transistor are electrically connected through the bridge pattern 30. Compared with the conventional semiconductor structure in which metal contacts are disposed in active regions of pull-down transistors such that the metal contacts are connected to a conductive metal wire to implement connection between the active regions of the pull-down transistors, the present disclosure can effectively reduce areas of the active regions of the pull-down transistors, thereby reducing areas of a single cell and an array region. Since an area of an isolation space between adjacent pull-down transistors is reduced, large interference factors can be avoided. The first active region pattern region 10 and the second active region pattern region 20 are symmetrically arranged along the central axis of the bridge pattern 30, which can improve the uniformity of pattern shapes on the layout structure, reduce requirements on design rules for each layer of the layout structure, and reduce the complexity of a lithography process.

Figure 2:
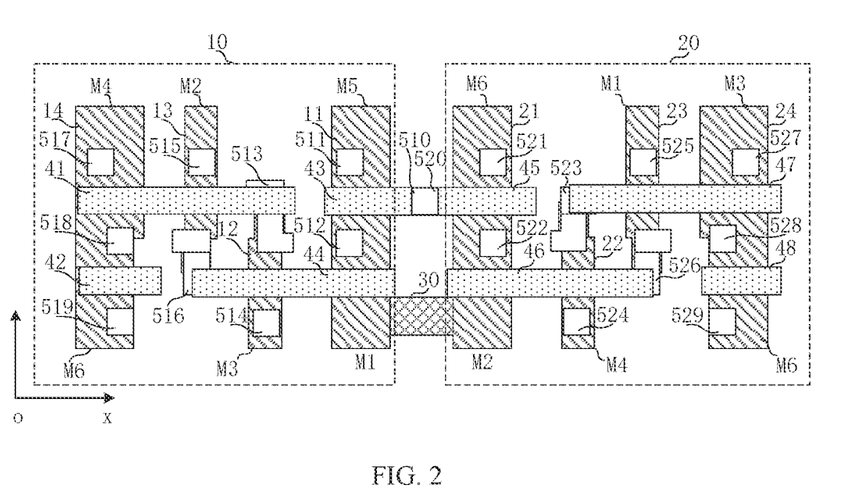
FIG. 2 is a schematic top view of a layout structure of a sense amplifier according to another embodiment of the present disclosure.

Further, referring to FIG. 2, in an embodiment of the present disclosure, the forming method of a sense amplifier further includes: forming a connection hole pattern layer on the first active region pattern layer 100, and forming a gate strip pattern layer on a surface of the connection hole pattern layer that is away from the first active region pattern layer 100, where the gate strip pattern layer partially overlaps with the first active region pattern layer 100 and is used for forming the first pull-down transistor M1 and the second pull-down transistor M2.

For example, further referring to FIG. 2, in an embodiment of the present disclosure, the first active region pattern region 10 further includes a second active region pattern 12, a third active region pattern 13, and a fourth active region pattern 14 that are sequentially arranged at intervals along the first direction, e.g., direction ox. The second active region pattern 12 is adjacent to the first active region pattern 11; the gate strip pattern layer includes a first gate strip pattern 41, a second gate strip pattern 42, a third gate strip pattern 43, and a fourth gate strip pattern 44. The first gate strip pattern 41 and the third gate strip pattern 43 are sequentially arranged at an interval along the first direction; the second gate strip pattern 42 and the fourth gate strip pattern 44 are sequentially arranged at an interval along the first direction; the first gate strip pattern 41 and the second gate strip pattern 42 are sequentially arranged at an interval along a second direction, e.g., direction oy; the third gate strip pattern 43 and the fourth gate strip pattern 44 are sequentially arranged at an interval along the second direction. The first active region pattern 11 overlaps with the third gate strip pattern 43 and the fourth gate strip pattern 44; the second active region pattern 12 overlaps with the first gate strip pattern 41 and the fourth gate strip pattern 44; the third active region pattern 13 overlaps with the first gate strip pattern 41 and the fourth gate strip pattern 44; the fourth active region pattern 14 overlaps with the first gate strip pattern 41 and the second gate strip pattern 42.

For example, further referring to FIG. 2, in an embodiment of the present disclosure, the first gate strip pattern 41 and the fourth active region pattern 14, which is located at both sides of the first gate strip pattern 41 along the second direction, e.g., direction oy, are used for forming a fifth fourth MOS transistor; the second gate strip pattern 42 and the fourth active region pattern 14, which is located at both sides of the second gate strip pattern 42 along the second direction, are used for forming a sixth MOS transistor; the first gate strip pattern 41 and the third active region pattern 13, which is located at both sides of the first gate strip pattern 41 along the second direction, are used for forming a second MOS transistor; the fourth gate strip pattern 44 and the second active region pattern 12, which is located at both sides of the fourth gate strip pattern 44 along the second direction, are used for forming a third MOS transistor; the third gate strip pattern 43 and the first active region pattern 11, which is located at both sides of the third gate strip pattern 43 along the second direction, are used for forming a fifth MOS transistor; the fourth gate strip pattern 44 and the first active region pattern 11, which is located at both sides of the fourth gate strip pattern 44 along the second direction, are used for forming a first MOS transistor.

For example, further referring to FIG. 2, in an embodiment of the present disclosure, the connection hole pattern layer includes a first connection hole pattern 511, a second connection hole pattern 512, a third connection hole pattern 513, a fourth connection hole pattern 514, a fifth connection hole pattern 515, a sixth connection hole pattern 516, a seventh connection hole pattern 517, an eighth connection hole pattern 518, a ninth connection hole pattern 519, and a tenth connection hole pattern 510. The first connection hole pattern 511 is located in the first active region pattern 11 at a side of the third gate strip pattern 43 that is away from the fourth gate strip pattern 44; the second connection hole pattern 512 is located in the first active region pattern 11 between the third gate strip pattern 43 and the fourth gate strip pattern 44; the second active region pattern 12 overlaps with the first gate strip pattern 41 to form a first overlapping region, and the third connection hole pattern 513 covers the first overlapping region; the fourth connection hole pattern 514 is located in the second active region pattern 12 at a side of the fourth gate strip pattern 44 that is away from the first gate strip pattern 41; the fifth connection hole pattern 515 is located in the third active region pattern 13 at a side of the first gate strip pattern 41 that is away from the fourth gate strip pattern 44; the third active region pattern 13 overlaps with the fourth gate strip pattern 44 to form a second overlapping region, and the sixth connection hole pattern 516 covers the second overlapping region; the seventh connection hole pattern 517 is located in the fourth active region pattern 14 at a side of the first gate strip pattern 41 that is away from the second gate strip pattern 42; the eighth connection hole pattern 518 is located in the fourth active region pattern 14 between the first gate strip pattern 41 and the second gate strip pattern 42; the ninth connection hole pattern 519 is located in the fourth active region pattern 14 at a side of the second gate strip pattern 42 that is away from the first gate strip pattern 41; the tenth connection hole pattern 510 is located in the third gate strip pattern 43 between the first active region pattern 11 and the first symmetrical active region pattern 21.

For example, further referring to FIG. 2, in an embodiment of the present disclosure, the second active region pattern region 20 includes a fifth gate strip pattern 45, a sixth gate strip pattern 46, a seventh gate strip pattern 47, and an eighth gate strip pattern 48; the fifth gate strip pattern 45 and the first gate strip pattern 41 are symmetrically arranged along the first direction, with an axis of symmetry being an axis of symmetry of the first active region pattern region 10 and the second active region pattern region 20 along the first direction; the sixth gate strip pattern 46 and the second gate strip pattern 42 are symmetrically arranged along the first direction; the seventh gate strip pattern 47 and the third gate strip pattern 43 are symmetrically arranged along the first direction; and the eighth gate strip pattern 48 and the fourth gate strip pattern 44 are symmetrically arranged along the first direction.

For example, further referring to FIG. 2, in an embodiment of the present disclosure, the gate strip pattern layer further includes a fifth gate strip pattern 45, a sixth gate strip pattern 46, a seventh gate strip pattern 47, and an eighth gate strip pattern 48; the connection hole pattern layer further includes a first symmetrical connection hole pattern 521, a second symmetrical connection hole pattern 522, a third symmetrical connection hole pattern 523, a fourth symmetrical connection hole pattern 524, a fifth symmetrical connection hole pattern 525, a sixth symmetrical connection hole pattern 526, a seventh symmetrical connection hole pattern 527, an eighth symmetrical connection hole pattern 528, a ninth symmetrical connection hole pattern 529, and a tenth symmetrical connection hole pattern 520. The first symmetrical active region pattern 21 and the first active region pattern 11 may be horizontally symmetrical; the second symmetrical active region pattern 22 and the second active region pattern 12 may be horizontally symmetrical; the third symmetrical active region pattern 23 and the third active region pattern 13 may be horizontally symmetrical; the fourth symmetrical active region pattern 24 and the fourth active region pattern 14 may be horizontally symmetrical. The first symmetrical connection hole pattern 521 and the first connection hole pattern 511 may be horizontally symmetrical; the second symmetrical connection hole pattern 522 and the second connection hole pattern 512 may be horizontally symmetrical; the third symmetrical connection hole pattern 523 and the third connection hole pattern 513 may be horizontally symmetrical; the fourth symmetrical connection hole pattern 524 and the fourth connection hole pattern 514 may be horizontally symmetrical; the fifth symmetrical connection hole pattern 525 and the fifth connection hole pattern 515 may be horizontally symmetrical; the sixth symmetrical connection hole pattern 526 and the sixth connection hole pattern 516 may be horizontally symmetrical; the seventh symmetrical connection hole pattern 527 and the seventh connection hole pattern 517 may be horizontally symmetrical; the eighth symmetrical connection hole pattern 528 and the eighth connection hole pattern 518 may be horizontally symmetrical; the ninth symmetrical connection hole pattern 529 and the ninth connection hole pattern 519 may be horizontally symmetrical; the tenth symmetrical connection hole pattern 520 and the tenth connection hole pattern 510 may be horizontally symmetrical.

Figure 3:
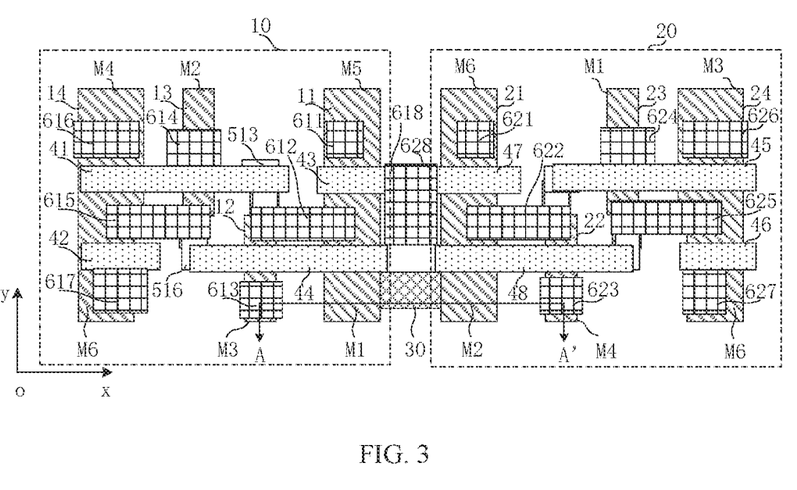
FIG. 3 is a schematic top view of a layout structure of a sense amplifier according to further another embodiment of the present disclosure.

Further, referring to FIG. 3, in an embodiment of the present disclosure, the forming method of a sense amplifier further includes: forming a metal pattern layer on a surface of the gate strip pattern layer that is away from the first active region pattern layer 100, where the metal pattern layer includes a first metal pattern 611, a second metal pattern 612, a third metal pattern 613, a fourth metal pattern 614, a fifth metal pattern 615, a sixth metal pattern 616, a seventh metal pattern 617, and an eighth metal pattern 618; the first metal pattern 611 covers the first connection hole pattern 511; the second metal pattern 612 covers the second connection hole pattern 512 and a part of the third connection hole pattern 513; the third metal pattern 613 covers the fourth connection hole pattern 514; the fourth metal pattern 614 covers the fifth connection hole pattern 515; the fifth metal pattern 615 covers a part of the sixth connection hole pattern 516 and the eighth connection hole pattern 518; the sixth metal pattern 616 covers the seventh connection hole pattern 517; the seventh metal pattern 617 covers the ninth connection hole pattern 519; and the eighth metal pattern 618 covers the tenth connection hole pattern 510.

Figure 4:
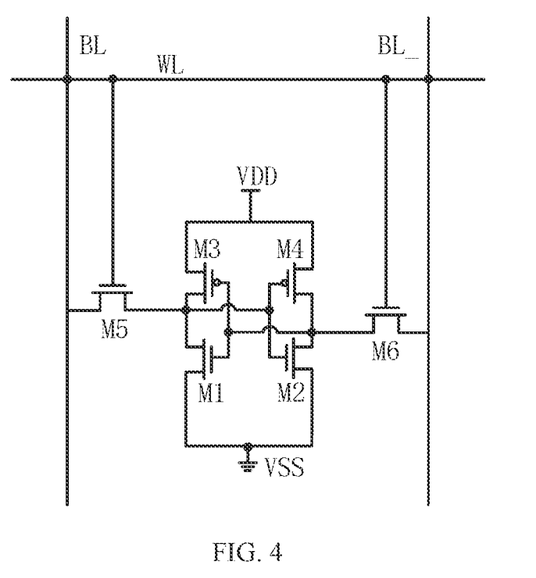
FIG. 4 is a schematic diagram of a memory cell circuit according to an embodiment of the present disclosure.

For example, further referring to FIG. 3, in an embodiment of the present disclosure, the metal pattern layer includes a first symmetrical metal pattern 621, a second symmetrical metal pattern 622, a third symmetrical metal pattern 623, a fourth symmetrical metal pattern 624, a fifth symmetrical metal pattern 625, a sixth symmetrical metal pattern 626, a seventh symmetrical metal pattern 627, and an eighth symmetrical metal pattern 628. The first symmetrical metal pattern 621 and the first metal pattern 611 may be horizontally symmetrical; the second symmetrical metal pattern 622 and the second metal pattern 612 may be horizontally symmetrical; the third symmetrical metal pattern 623 and the third metal pattern 613 may be horizontally symmetrical; the fourth symmetrical metal pattern 624 and the fourth metal pattern 614 may be horizontally symmetrical; the fifth symmetrical metal pattern 625 and the fifth metal pattern 615 may be horizontally symmetrical; the sixth symmetrical metal pattern 626 and the sixth metal pattern 616 may be horizontally symmetrical; the seventh symmetrical metal pattern 627 and the seventh metal pattern 617 may be horizontally symmetrical; the eighth symmetrical metal pattern 628 and the eighth metal pattern 618 may be horizontally symmetrical. In this way, the layout structure of the sense amplifier circuit as shown in FIG. 4 can be designed. As shown in FIG. 3, the source of the first pull-down transistor M1 and the source of the second pull-down transistor M2 may be electrically connected through the bridge pattern and grounded, which can effectively reduce areas of the active regions where the pull-down transistors are arranged, thereby reducing areas of a single cell and an array region. Since an area of an isolation space between adjacent pull-down transistors is reduced, large interference factors can be avoided. The first active region pattern region and the second active region pattern region are symmetrically arranged along the central axis of the bridge pattern, which can improve the uniformity of pattern shapes on the layout structure, reduce requirements on design rules for each layer of the layout structure, and reduce the complexity of a lithography process.

For example, further referring to FIG. 3, in an embodiment of the present disclosure, the bridge pattern 30 may be in a rectangular shape, to improve the uniformity of pattern shapes on the layout structure, thereby reducing requirements on design rules for each layer of the layout structure, and reducing the complexity of a lithography process. The bridge pattern 30 may extend along the first direction, e.g., direction ox; a length of the bridge pattern 30 along the second direction, e.g., direction oy, may be greater than or equal to a preset width threshold, to reduce the parasitic capacitance caused by the bridge pattern 30.

For example, in an embodiment of the present disclosure, the forming method of a sense amplifier further includes: providing a first symmetrical active region pattern layer, where the first symmetrical active region pattern layer (not shown) and the first active region pattern layer are symmetrically arranged at an interval along the second direction, e.g., direction oy, and the second direction is perpendicular to the first direction, so as to form a layout structure including a plurality of memory cell structures, thereby reducing complexity of the layout structure design, and improving the yield and reliability of manufactured memory cell structure products.

For example, in an embodiment of the present disclosure, the first memory cell structure is a 6T SRAM; and/or the second memory cell structure is a 6T SRAM.

For example, further referring to FIG. 1, in an embodiment of the present disclosure, a layout structure of a sense amplifier is provided, including: a first active region pattern layer 100, where the first active region pattern layer 100 includes a bridge pattern 30, and a first active region pattern region 10 and a second active region pattern region 20 that are spaced apart in a first direction and symmetrically arranged along a central axis of the bridge pattern 30; the first active region pattern region 10 is used for defining a first memory cell structure, and includes a first active region pattern 11 for defining a first pull-down transistor of the first memory cell structure; the second active region pattern region 20 is used for defining a second memory cell structure, and includes a first symmetrical active region pattern 21 for defining a second pull-down transistor of the second memory cell structure; and the first active region pattern 11 and the first symmetrical active region pattern 21 are adjacent to each other and connected through the bridge pattern 30, such that a source of the first pull-down transistor and a source of the second pull-down transistor are electrically connected through the bridge pattern 30.

Using the pull-down transistor as an example, further referring to FIG. 2, in an embodiment of the present disclosure, the layout structure of a sense amplifier further includes a connection hole pattern layer and a gate strip pattern layer, where the connection hole pattern layer is located on the first active region pattern layer 100, the gate strip pattern layer is located on a surface of the connection hole pattern layer that is away from the first active region pattern layer 100, and the gate strip pattern layer partially overlaps with the first active region pattern layer 100 and is used for forming the first pull-down transistor and the second pull-down transistor.

For example, further referring to FIG. 2 and FIG. 4, in an embodiment of the present disclosure, the first active region pattern region 10 further includes a second active region pattern 12, a third active region pattern 13, and a fourth active region pattern 14 that are sequentially arranged at intervals along the first direction. The second active region pattern 12 is adjacent to the first active region pattern 11. The gate strip pattern layer includes a first gate strip pattern 41, a second gate strip pattern 42, a third gate strip pattern 43, and a fourth gate strip pattern 44. The first gate strip pattern 41 and the third gate strip pattern 43 are sequentially arranged at an interval along the first direction; the second gate strip pattern 42 and the fourth gate strip pattern 44 are sequentially arranged at an interval along the first direction; the first gate strip pattern 41 and the second gate strip pattern 42 are sequentially arranged at an interval along a second direction; the third gate strip pattern 43 and the fourth gate strip pattern 44 are sequentially arranged at an interval along the second direction. The first active region pattern 11 overlaps with the third gate strip pattern 43 and the fourth gate strip pattern 44; the second active region pattern 12 overlaps with the first gate strip pattern 41 and the fourth gate strip pattern 44; the third active region pattern 13 overlaps with the first gate strip pattern 41 and the fourth gate strip pattern 44; the fourth active region pattern 14 overlaps with the first gate strip pattern 41 and the second gate strip pattern 42. The first gate strip pattern 41 and the fourth active region pattern 14, which is located at both sides of the first gate strip pattern 41 along the second direction, are used for forming a fourth MOS transistor; the second gate strip pattern 42 and the fourth active region pattern 14, which is located at both sides of the second gate strip pattern 42 along the second direction, are used for forming a sixth MOS transistor; the first gate strip pattern 41 and the third active region pattern 13, which is located at both sides of the first gate strip pattern 41 along the second direction, are used for forming a second MOS transistor; the fourth gate strip pattern 44 and the second active region pattern 12, which is located at both sides of the fourth gate strip pattern 44 along the second direction, are used for forming a third MOS transistor; the third gate strip pattern 43 and the first active region pattern 11, which is located at both sides of the third gate strip pattern 43 along the second direction, are used for forming a fifth MOS transistor; the fourth gate strip pattern 44 and the first active region pattern 11, which is located at both sides of the fourth gate strip pattern 44 along the second direction, are used for forming a first MOS transistor.

For example, further referring to FIG. 2, in an embodiment of the present disclosure, the second active region pattern region 20 includes a fifth gate strip pattern 45, a sixth gate strip pattern 46, a seventh gate strip pattern 47, and an eighth gate strip pattern 48; the fifth gate strip pattern 45 and the first gate strip pattern 41 are symmetrically arranged along the first direction, with an axis of symmetry being an axis of symmetry of the first active region pattern region 10 and the second active region pattern region 20 along the first direction; the sixth gate strip pattern 46 and the second gate strip pattern 42 are symmetrically arranged along the first direction; the seventh gate strip pattern 47 and the third gate strip pattern 43 are symmetrically arranged along the first direction; and the eighth gate strip pattern 48 and the fourth gate strip pattern 44 are symmetrically arranged along the first direction.

For example, further referring to FIG. 2, in an embodiment of the present disclosure, the connection hole pattern layer includes a first connection hole pattern 511, a second connection hole pattern 512, a third connection hole pattern 513, a fourth connection hole pattern 514, a fifth connection hole pattern 515, a sixth connection hole pattern 516, a seventh connection hole pattern 517, an eighth connection hole pattern 518, a ninth connection hole pattern 519, and a tenth connection hole pattern 510. The first connection hole pattern 511 is located in the first active region pattern 11 at a side of the third gate strip pattern 43 that is away from the fourth gate strip pattern 44; the second connection hole pattern 512 is located in the first active region pattern 11 between the third gate strip pattern 43 and the fourth gate strip pattern 44; the second active region pattern 12 overlaps with the first gate strip pattern 41 to form a first overlapping region, and the third connection hole pattern 513 covers the first overlapping region; the fourth connection hole pattern 514 is located in the second active region pattern 12 at a side of the fourth gate strip pattern 44 that is away from the first gate strip pattern 41; the fifth connection hole pattern 515 is located in the third active region pattern 13 at a side of the first gate strip pattern 41 that is away from the fourth gate strip pattern 44; the third active region pattern 13 overlaps with the fourth gate strip pattern 44 to form a second overlapping region, and the sixth connection hole pattern 516 covers the second overlapping region; the seventh connection hole pattern 517 is located in the fourth active region pattern 14 at a side of the first gate strip pattern 41 that is away from the second gate strip pattern 42; the eighth connection hole pattern 518 is located in the fourth active region pattern 14 between the first gate strip pattern 41 and the second gate strip pattern 42; the ninth connection hole pattern 519 is located in the fourth active region pattern 14 at a side of the second gate strip pattern 42 that is away from the first gate strip pattern 41; the tenth connection hole pattern 510 is located in the third gate strip pattern 43 between the first active region pattern 11 and the first symmetrical active region pattern 21.

For example, further referring to FIG. 3, in an embodiment of the present disclosure, the layout structure of a sense amplifier further includes a metal pattern layer, located on a surface of the gate strip pattern layer that is away from the first active region pattern layer 100, where the metal pattern layer includes a first metal pattern 611, a second metal pattern 612, a third metal pattern 613, a fourth metal pattern 614, a fifth metal pattern 615, a sixth metal pattern 616, a seventh metal pattern 617, and an eighth metal pattern 618; the first metal pattern 611 covers the first connection hole pattern 511; the second metal pattern 612 covers the second connection hole pattern 512 and a part of the third connection hole pattern 513; the third metal pattern 613 covers the fourth connection hole pattern 514; the fourth metal pattern 614 covers the fifth connection hole pattern 515; the fifth metal pattern 615 covers a part of the sixth connection hole pattern 516 and the eighth connection hole pattern 518; the sixth metal pattern 616 covers the seventh connection hole pattern 517; the seventh metal pattern 617 covers the ninth connection hole pattern 519; and the eighth metal pattern 618 covers the tenth connection hole pattern 510.

For example, further referring to FIG. 4, in an embodiment of the present disclosure, a memory cell circuit is provided, including a first MOS transistor M1, a second MOS transistor M2, a third MOS transistor M3, a fourth MOS transistor M4, a fifth MOS transistor M5, and a sixth MOS transistor M6. A source of the third MOS transistor M3 and a source of the fourth MOS transistor M4 are both connected to a power line VDD. A source of the first MOS transistor M1 and a source of the second MOS transistor M2 are both connected to a ground line VSS. A drain of the third MOS transistor M3 is connected to a source of the fifth MOS transistor M5, a drain of the first MOS transistor M1, a gate of the fourth MOS transistor M4, and a gate of the second MOS transistor M2. A drain of the fourth MOS transistor M4 is connected to a source of the sixth MOS transistor M6, a drain of the second MOS transistor M2, a gate of the third MOS transistor M3, and a gate of the first MOS transistor M1. Gates of the fifth MOS transistor M5 and the sixth MOS transistor M6 are both connected to a word line WL. A drain of the fifth MOS transistor M5 is connected to a bit line BL, and a drain of the sixth MOS transistor M6 is connected to a complementary bit line BL_.

Figure 5:
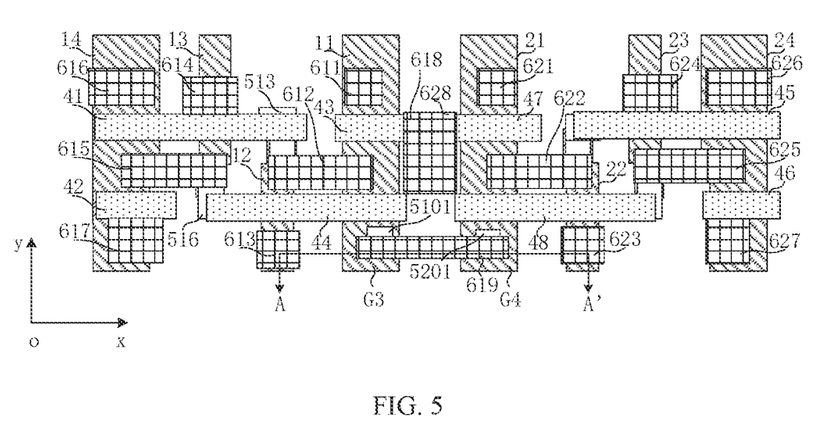
FIG. 5 is a schematic top view of a layout structure of a conventional sense amplifier.

For example, FIG. 5, which is a schematic top view of a layout structure of a conventional sense amplifier, is different from the schematic top view of the layout structure of a sense amplifier shown in FIG. 3 in that, FIG. 5 at least further includes an eleventh connection hole pattern 5101, a twelfth connection hole pattern 5201, and a conductive metal wire 619, where the eleventh connection hole pattern 5101 is disposed in an active region of a pull-down transistor G3, the twelfth connection hole pattern 5201 is disposed in an active region of a pull-down transistor G4, and the eleventh connection hole pattern 5101 is electrically connected to the twelfth connection hole pattern 5201 through the conductive metal wire 619.

Figure 6A:
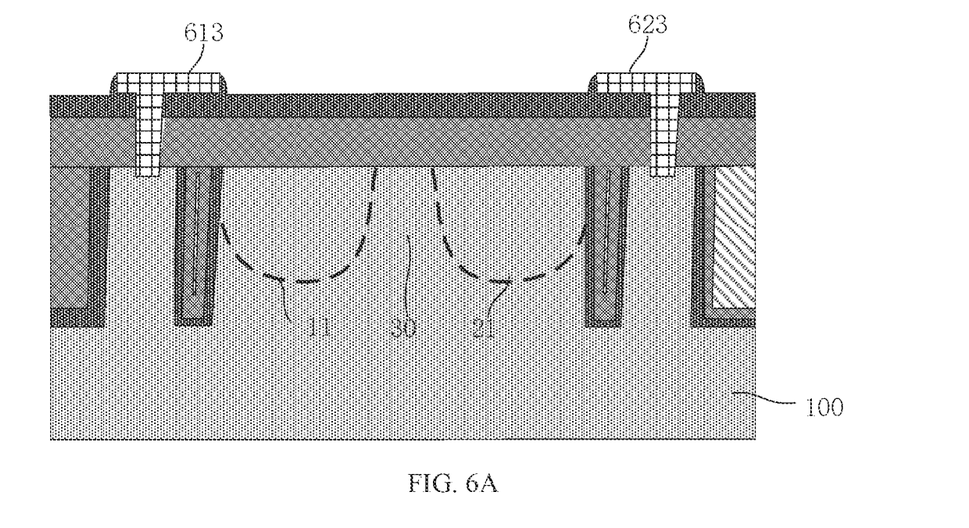
FIG. 6A is a schematic structural diagram of a cross section taken along direction AA' in FIG. 3.
Figure 6B:
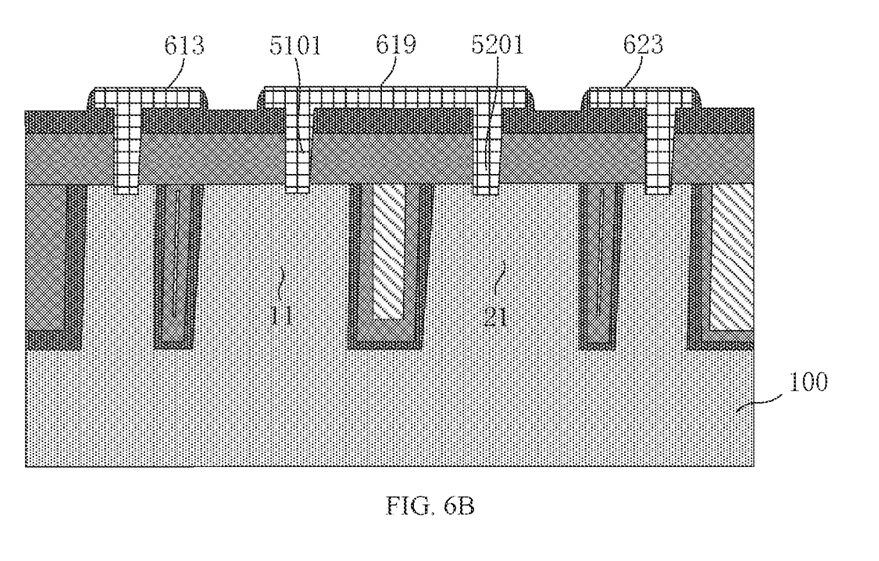
FIG. 6B is a schematic structural diagram of a cross section taken along direction AA' in FIG. 5.

In the conventional semiconductor structure shown in FIG. 5 and FIG. 6a, the eleventh connection hole pattern 5101 is disposed in the active region of the pull-down transistor G3, and the twelfth connection hole pattern 5201 is disposed in the active region of the pull-down transistor G4, such that the eleventh connection hole pattern 5101 and the twelfth connection hole pattern 5201 are electrically connected through the conductive metal wire 619, to implement electrical connection between the active region of the pull-down transistor G3 and the active region of the pull-down transistor G4. Compared with the conventional semiconductor structure, in the present disclosure, the active region of the first pull-down transistor M1 and the active region of the second pull-down transistor M2 are electrically connected through the bridge pattern 30, thus omitting at least the eleventh connection hole pattern 5101, the twelfth connection hole pattern 5201, and the conductive metal wire 619, which can effectively reduce the area of the active region for disposing the pull-down transistor, thereby reducing areas of a single cell and an array region. Since an area of an isolation space between adjacent pull-down transistors is reduced, large interference factors can be avoided. The first active region pattern region 10 and the second active region pattern region 20 are symmetrically arranged along the central axis of the bridge pattern 30, which can improve the uniformity of pattern shapes on the layout structure, reduce requirements on design rules for each layer of the layout structure, and reduce the complexity of a lithography process to facilitate optical proximity correction. The present disclosure can implement alignment by using patterns on a previous layer, which improves the accuracy of alignment.

In an embodiment of the present disclosure, the bridge pattern 30 extends along the first direction; a length of the bridge pattern 30 along the second direction is greater than or equal to a preset width threshold, to reduce the parasitic capacitance caused by the bridge pattern 30.

In an embodiment of the present disclosure, the layout structure of a sense amplifier further includes a first symmetrical active region pattern layer, where the first symmetrical active region pattern layer and the first active region pattern layer are symmetrically arranged at an interval along the second direction. The second direction may be perpendicular to the first direction, so as to form a layout structure including a plurality of memory cell structures, thereby reducing complexity of the layout structure design, and improving the yield and reliability of manufactured memory cell structure products.

It may be noted that the foregoing embodiments are merely for the purpose of description instead of limiting the present disclosure.

It should be understood that the execution order of the steps is not strictly limited, and the steps may be executed in other orders, unless clearly described otherwise. Moreover, at least some of the steps may include a plurality of sub-steps or stages. The sub-steps or stages are not necessarily executed at the same time, but may be executed at different times. The execution order of the sub-steps or stages is not necessarily carried out sequentially, but may be executed alternately with other steps or at least some of the sub-steps or stages of other steps.

The embodiments of this specification are described in a progressive manner, and each embodiment focuses on differences from other embodiments. The same or similar parts between the embodiments may refer to each other.

The technical characteristics of the above examples can be employed in arbitrary combinations. To provide a concise description of these examples, all possible combinations of all technical characteristics of the embodiment may not be described; however, these combinations of technical characteristics should be construed as disclosed in the description as long as no contradiction occurs.

Only several implementations of the present disclosure are described in detail in the foregoing embodiments, but they should not therefore be construed as limiting the scope of the present disclosure. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:

1. A forming method of a sense amplifier, comprising:
   providing a first active region pattern layer, wherein the first active region pattern layer comprises a bridge pattern, and a first active region pattern region and a second active region pattern region that are spaced apart in a first direction and symmetrically arranged along a central axis of the bridge pattern, wherein
   the first active region pattern region is used for defining a first memory cell structure, and comprises a first active region pattern for defining a first pull-down transistor of the first memory cell structure;
   the second active region pattern region is used for defining a second memory cell structure, and comprises a first symmetrical active region pattern for defining a second pull-down transistor of the second memory cell structure; and
   the first active region pattern and the first symmetrical active region pattern are adjacent to each other and connected through the bridge pattern, such that a source of the first pull-down transistor and a source of the second pull-down transistor are electrically connected through the bridge pattern;
forming a connection hole pattern layer on the first active region pattern layer; and
forming a gate strip pattern layer on a surface of the connection hole pattern layer that is away from the first active region pattern layer, wherein:
  the gate strip pattern layer partially overlaps with the first active region pattern layer and is used for forming the first pull-down transistor and the second pull-down transistor;
  the first active region pattern region further comprises a second active region pattern, a third active region pattern, and a fourth active region pattern that are sequentially arranged at intervals along the first direction, the second active region pattern being adjacent to the first active region pattern;
  the gate strip pattern layer comprises a first gate strip pattern, a second gate strip pattern, a third gate strip pattern, and a fourth gate strip pattern;
  the first gate strip pattern and the third gate strip pattern are sequentially arranged at intervals along the first direction;
  the second gate strip pattern and the fourth gate strip pattern are sequentially arranged at intervals along the first direction;
  the first gate strip pattern and the second gate strip pattern are sequentially arranged at intervals along a second direction;
  the third gate strip pattern and the fourth gate strip pattern are sequentially arranged at intervals along the second direction;
  the first active region pattern overlaps with the third gate strip pattern and the fourth gate strip pattern;
  the second active region pattern overlaps with the first gate strip pattern and the fourth gate strip pattern;
  the third active region pattern overlaps with the first gate strip pattern and the fourth gate strip pattern;
  the fourth active region pattern overlaps with the first gate strip pattern and the second gate strip pattern;
  the first gate strip pattern and the fourth active region pattern, which is located at both sides of the first gate strip pattern along the second direction, are used for forming a fourth metal oxide semiconductor (MOS) transistor;
  the second gate strip pattern and the fourth active region pattern, which is located at both sides of the second gate strip pattern along the second direction, are used for forming a sixth MOS transistor;
  the first gate strip pattern and the third active region pattern, which is located at both sides of the first gate strip pattern, are used for forming a second MOS transistor;
  the fourth gate strip pattern and the second active region pattern, which is located at both sides of the fourth gate strip pattern along the second direction, are used for forming a third MOS transistor;
  the third gate strip pattern and the first active region pattern, which is located at both sides of the third gate strip pattern along the second direction, are used for forming a fifth MOS transistor; and
  the fourth gate strip pattern and the first active region pattern, which is located at both sides of the fourth gate strip pattern along the second direction, are used for forming a first MOS transistor.

2. The forming method of a sense amplifier according to claim 1, wherein the connection hole pattern layer comprises a first connection hole pattern, a second connection hole pattern, a third connection hole pattern, a fourth connection hole pattern, a fifth connection hole pattern, a sixth connection hole pattern, a seventh connection hole pattern, an eighth connection hole pattern, a ninth connection hole pattern, and a tenth connection hole pattern;
  the first connection hole pattern is located in the first active region pattern at a side of the third gate strip pattern that is away from the fourth gate strip pattern;
  the second connection hole pattern is located in the first active region pattern between the third gate strip pattern and the fourth gate strip pattern;
  the second active region pattern overlaps with the first gate strip pattern to form a first overlapping region, and the third connection hole pattern covers the first overlapping region;
  the fourth connection hole pattern is located in the second active region pattern at a side of the fourth gate strip pattern that is away from the first gate strip pattern;
  the fifth connection hole pattern is located in the third active region pattern at a side of the first gate strip pattern that is away from the fourth gate strip pattern;
  the third active region pattern overlaps with the fourth gate strip pattern to form a second overlapping region, and the sixth connection hole pattern covers the second overlapping region;
  the seventh connection hole pattern is located in the fourth active region pattern at a side of the first gate strip pattern that is away from the second gate strip pattern;
  the eighth connection hole pattern is located in the fourth active region pattern between the first gate strip pattern and the second gate strip pattern;
  the ninth connection hole pattern is located in the fourth active region pattern at a side of the second gate strip pattern that is away from the first gate strip pattern; and
  the tenth connection hole pattern is located in the third gate strip pattern between the first active region pattern and the first symmetrical active region pattern.

3. The forming method of a sense amplifier according to claim 2, the method further comprises:
  forming a metal pattern layer on a surface of the gate strip pattern layer that is away from the first active region pattern layer, wherein the metal pattern layer comprises a first metal pattern, a second metal pattern, a third metal pattern, a fourth metal pattern, a fifth metal pattern, a sixth metal pattern, a seventh metal pattern, and an eighth metal pattern;
  the first metal pattern covers the first connection hole pattern;
  the second metal pattern covers the second connection hole pattern and a part of the third connection hole pattern;
  the third metal pattern covers the fourth connection hole pattern;
  the fourth metal pattern covers the fifth connection hole pattern;
  the fifth metal pattern covers a part of the sixth connection hole pattern and the eighth connection hole pattern;
  the sixth metal pattern covers the seventh connection hole pattern;
  the seventh metal pattern covers the ninth connection hole pattern; and
  the eighth metal pattern covers the tenth connection hole pattern.

4. The forming method of a sense amplifier according to claim 3, wherein the second active region pattern region comprises a fifth gate strip pattern, a sixth gate strip pattern, a seventh gate strip pattern, and an eighth gate strip pattern;

the fifth gate strip pattern and the first gate strip pattern are symmetrically arranged along the first direction, with an axis of symmetry being an axis of symmetry of the first active region pattern region and the second active region pattern region along the first direction;

the sixth gate strip pattern and the second gate strip pattern are symmetrically arranged along the first direction;

the seventh gate strip pattern and the third gate strip pattern are symmetrically arranged along the first direction; and the eighth gate strip pattern and the fourth gate strip pattern are symmetrically arranged along the first direction.

5. The forming method of a sense amplifier according to claim 1, wherein the bridge pattern is in a rectangular shape.

6. The forming method of a sense amplifier according to claim 5, wherein the bridge pattern extends along the first direction.

7. The forming method of a sense amplifier according to claim 5, wherein a length of the bridge pattern in the second direction is greater than or equal to a preset width threshold.

8. The forming method of a sense amplifier according to claim 1, the method further comprises:

providing a first symmetrical active region pattern layer, wherein the first symmetrical active region pattern layer and the first active region pattern layer are symmetrically arranged at a third interval along the second direction, and the second direction is perpendicular to the first direction.

9. The forming method of a sense amplifier according to claim 1, wherein at least one of the first memory cell structure is a 6T static random access memory (SRAM); or the second memory cell structure is a 6T SRAM.

10. A layout structure of a sense amplifier, comprising a first active region pattern layer, a connection hole pattern layer and a gate strip pattern layer, wherein:

the first active region pattern layer comprises a bridge pattern, and a first active region pattern region and a second active region pattern region that are spaced apart in a first direction and symmetrically arranged along a central axis of the bridge pattern;

the first active region pattern region is used for defining a first memory cell structure, and comprises a first active region pattern for defining a first pull-down transistor of the first memory cell structure;

the second active region pattern region is used for defining a second memory cell structure, and comprises a first symmetrical active region pattern for defining a second pull-down transistor of the second memory cell structure;

the first active region pattern and the first symmetrical active region pattern are adjacent to each other and connected through the bridge pattern, such that a source of the first pull-down transistor and a source of the second pull-down transistor are electrically connected through the bridge pattern;

the connection hole pattern layer is located on the first active region pattern layer;

the gate strip pattern layer is located on a surface of the connection hole pattern layer that is away from the first active region pattern layer;

the gate strip pattern layer partially overlaps with the first active region pattern layer and is used for forming the first pull-down transistor and the second pull-down transistor;

the first active region pattern region further comprises a second active region pattern, a third active region pattern, and a fourth active region pattern that are sequentially arranged at intervals along the first direction, the second active region pattern being adjacent to the first active region pattern;

the gate strip pattern layer comprises a first gate strip pattern, a second gate strip pattern, a third gate strip pattern, and a fourth gate strip pattern;

the first gate strip pattern and the third gate strip pattern are sequentially arranged at intervals along the first direction;

the second gate strip pattern and the fourth gate strip pattern are sequentially arranged at intervals along the first direction;

the first gate strip pattern and the second gate strip pattern are sequentially arranged at intervals along a second direction;

the third gate strip pattern and the fourth gate strip pattern are sequentially arranged at intervals along the second direction;

the first active region pattern overlaps with the third gate strip pattern and the fourth gate strip pattern;

the second active region pattern overlaps with the first gate strip pattern and the fourth gate strip pattern;

the third active region pattern overlaps with the first gate strip pattern and the fourth gate strip pattern; and the fourth active region pattern overlaps with the first gate strip pattern and the second gate strip pattern;

the first gate strip pattern and the fourth active region pattern, which is located at both sides of the first gate strip pattern along the second direction, are used for forming a fourth metal oxide semiconductor (MOS) transistor;

the second gate strip pattern and the fourth active region pattern, which is located at both sides of the second gate strip pattern along the second direction, are used for forming a sixth MOS transistor;

the first gate strip pattern and the third active region pattern, which is located at both sides of the first gate strip pattern, are used for forming a second MOS transistor;

the fourth gate strip pattern and the second active region pattern, which is located at both sides of the fourth gate strip pattern along the second direction, are used for forming a third MOS transistor;

the third gate strip pattern and the first active region pattern, which is located at both sides of the third gate strip pattern along the second direction, are used for forming a fifth MOS transistor; and the fourth gate strip pattern and the first active region pattern, which is located at both sides of the fourth gate strip pattern along the second direction, are used for forming a first MOS transistor.

11. The layout structure of a sense amplifier according to claim 10, wherein the connection hole pattern layer comprises a first connection hole pattern, a second connection hole pattern, a third connection hole pattern, a fourth connection hole pattern, a fifth connection hole pattern, a sixth connection hole pattern, a seventh connection hole pattern, an eighth connection hole pattern, a ninth connection hole pattern, and a tenth connection hole pattern;

the first connection hole pattern is located in the first active region pattern at a side of the third gate strip pattern that is away from the fourth gate strip pattern;

the second connection hole pattern is located in the first active region pattern between the third gate strip pattern and the fourth gate strip pattern;

the second active region pattern overlaps with the first gate strip pattern to form a first overlapping region, and the third connection hole pattern covers the first overlapping region;

the fourth connection hole pattern is located in the second active region pattern at a side of the fourth gate strip pattern that is away from the first gate strip pattern;

the fifth connection hole pattern is located in the third active region pattern at a side of the first gate strip pattern that is away from the fourth gate strip pattern;

the third active region pattern overlaps with the fourth gate strip pattern to form a second overlapping region, and the sixth connection hole pattern covers the second overlapping region;

the seventh connection hole pattern is located in the fourth active region pattern at aside of the first gate strip pattern that is away from the second gate strip pattern;

the eighth connection hole pattern is located in the fourth active region pattern between the first gate strip pattern and the second gate strip pattern;

the ninth connection hole pattern is located in the fourth active region pattern at a side of the second gate strip pattern that is away from the first gate strip pattern; and the tenth connection hole pattern is located in the third gate strip pattern between the first active region pattern and the first symmetrical active region pattern.

12. The layout structure of a sense amplifier according to claim 11, the layout structure of the sense amplifier further comprises a metal pattern layer, located on a surface of the gate strip pattern layer that is away from the first active region pattern layer, wherein the metal pattern layer comprises a first metal pattern, a second metal pattern, a third metal pattern, a fourth metal pattern, a fifth metal pattern, a sixth metal pattern, a seventh metal pattern, and an eighth metal pattern;

the first metal pattern covers the first connection hole pattern;

the second metal pattern covers the second connection hole pattern and a part of the third connection hole pattern;

the third metal pattern covers the fourth connection hole pattern;

the fourth metal pattern covers the fifth connection hole pattern;

the fifth metal pattern covers a part of the sixth connection hole pattern and the eighth connection hole pattern;

the sixth metal pattern covers the seventh connection hole pattern;

the seventh metal pattern covers the ninth connection hole pattern; and the eighth metal pattern covers the tenth connection hole pattern.

13. The layout structure of a sense amplifier according to claim 12, wherein the second active region pattern region comprises a fifth gate strip pattern, a sixth gate strip pattern, a seventh gate strip pattern, and an eighth gate strip pattern;

the fifth gate strip pattern and the first gate strip pattern are symmetrically arranged along the first direction, with an axis of symmetry being an axis of symmetry of the first active region pattern region and the second active region pattern region along the first direction;

the sixth gate strip pattern and the second gate strip pattern are symmetrically arranged along the first direction;

the seventh gate strip pattern and the third gate strip pattern are symmetrically arranged along the first direction; and the eighth gate strip pattern and the fourth gate strip pattern are symmetrically arranged along the first direction.

14. The layout structure of a sense amplifier according to claim 10, wherein the bridge pattern extends along the first direction; and a length of the bridge pattern in the second direction is greater than or equal to a preset width threshold.

15. The layout structure of a sense amplifier according to claim 14, the layout structure of the sense amplifier further comprises a first symmetrical active region pattern layer, wherein the first symmetrical active region pattern layer and the first active region pattern layer are symmetrically arranged at intervals along the second direction, and the second direction is perpendicular to the first direction.

* * * * *